United States Patent
Do et al.

(10) Patent No.: US 8,035,193 B2
(45) Date of Patent: Oct. 11, 2011

(54) METHOD OF FABRICATING CAPACITOR IN SEMICONDUCTOR DEVICE

(75) Inventors: Kwan-Woo Do, Icheon-si (KR);
Kee-Jeung Lee, Icheon-si (KR);
Deok-Sin Kil, Icheon-si (KR);
Young-Dae Kim, Icheon-si (KR);
Jin-Hyock Kim, Icheon-si (KR);
Kyung-Woong Park, Icheon-si (KR);
Jeong-Yeop Lee, Icheon-si (KR)

(73) Assignee: Hynix Semiconductor Inc., Icheon-si, Gyeonggi-do (KR)

( * ) Notice: Subject to any disclaimer, the term of this patent is extended or adjusted under 35 U.S.C. 154(b) by 316 days.

(21) Appl. No.: 12/343,379

(22) Filed: Dec. 23, 2008

(65) Prior Publication Data

US 2009/0261454 A1   Oct. 22, 2009

(30) Foreign Application Priority Data

Apr. 18, 2008 (KR) .................. 10-2008-0035965

(51) Int. Cl.
*H01L 27/00* (2006.01)
(52) U.S. Cl. ........ 257/532; 257/295; 257/296; 257/306; 257/E21.009
(58) Field of Classification Search ... 257/E21.645–E21.694, E21.646–E21.66, 257/314–326, 68–71, 296–309, 225–234, 257/390; 438/275–278
See application file for complete search history.

(56) References Cited

U.S. PATENT DOCUMENTS

| | | | | |
|---|---|---|---|---|
| 3,773,555 A | * | 11/1973 | Cotton et al. | 427/123 |
| 2003/0047771 A1 | * | 3/2003 | Kweon et al. | 257/306 |
| 2004/0110356 A1 | * | 6/2004 | Yoon | 438/396 |
| 2007/0099420 A1 | * | 5/2007 | Dominguez et al. | 438/681 |
| 2008/0158303 A1 | * | 7/2008 | Kang et al. | 347/62 |

FOREIGN PATENT DOCUMENTS

| | | |
|---|---|---|
| KR | 1020020050415 | 6/2002 |
| KR | 1020060048987 | 5/2006 |
| KR | 1020070054022 | 5/2007 |
| KR | 1020070115146 | 12/2007 |

OTHER PUBLICATIONS

Korean Office Action for Korean patent application No. 10-2008-0035965.
Korean Notice of Allowance for application No. 10-2008-0035965.

* cited by examiner

*Primary Examiner* — Marcos D Pizarro Crespo
*Assistant Examiner* — Sue Tang
(74) *Attorney, Agent, or Firm* — Lowe Hauptman Ham & Berner LLP

(57) ABSTRACT

A capacitor includes a bottom electrode, a dielectric layer and a top electrode over a substrate. A $Ru_xTi_yO_z$ film is included in at least one of the bottom and top electrodes, where x, y and z are positive real numbers. A method of fabricating the capacitor through a sequential formation of a bottom electrode, a dielectric layer and a top electrode over a substrate includes forming a $Ru_xTi_yO_z$ film during a formation of at least one of the bottom electrode and top electrode, where x, y and z are positive real numbers.

14 Claims, 2 Drawing Sheets

METHOD OF FABRICATING CAPACITOR IN SEMICONDUCTOR DEVICE

CROSS-REFERENCE TO RELATED APPLICATIONS

The present application claims priority of Korean patent application number 10-2008-0035965, filed on Apr. 18, 2008, which is incorporated by reference herein in its entirety.

BACKGROUND

The present application relates to a method of fabricating a semiconductor device, and more particularly, to a capacitor in a semiconductor device and a method of fabricating the same.

In general, a capacitor used for a memory cell includes a bottom electrode for storage, a dielectric layer, and a top electrode for a plate. In the fabrication of such a capacitor, high-k materials should be used for the dielectric layer to ensure a relatively greater capacitance within a limited area. However, the high-k materials have generally low band gap energy, thus causing a problem of degrading a leakage current property of the devices despite having a relatively high permittivity.

Attempts have been made to use ruthenium (Ru) having a high work function as the bottom or top electrode. However, since Ru has a relatively low cohesive reaction tendency with other materials, it poorly adheres to the substrate and thus a deposited-Ru film expands in a blister shape, regardless of the kinds of substrates to be target-adhered.

A technology has been proposed where $RuO_2$ film with greater adhesive force and high work function is interposed below a Ru film, and is used as the bottom or top electrode. Although there are no particular adhesion problems in an initial deposition of the $RuO_2$ film, the $RuO_2$ film is reduced to decrease its thickness in subsequent processes, thereby causing a lifting of the $RuO_2$ film and a formation of voids between the $RuO_2$ film and the substrate.

SUMMARY

Embodiments are directed to using Ru as an electrode material to address problems related to substrate adhesion.

More specifically, by using a $Ru_xTi_yO_z$ film, (with a greater adhesive force, a high work function and a lower reduction tendency), as a bottom or top electrode, disclosed embodiments include a capacitor of a semiconductor device and a method for fabricating the same that are capable of ensuring properties of the capacitor and preventing formations of inferior products during fabrication.

In accordance with at least one embodiment, a capacitor of a semiconductor device includes a bottom electrode, a dielectric layer, and a top electrode over a substrate, the capacitor including a $Ru_xTi_yO_z$ film in at least one of the bottom electrode and the top electrode, where x, y and z are positive real numbers.

In other embodiments, a method for fabricating a capacitor of a semiconductor device includes sequentially forming a bottom electrode, dielectric layer, and top electrode over a substrate, the method including forming a $Ru_xTi_yO_z$ film during a formation of the bottom or top electrode, where x, y and z are positive real numbers.

DESCRIPTION OF EMBODIMENTS

Figure 1:
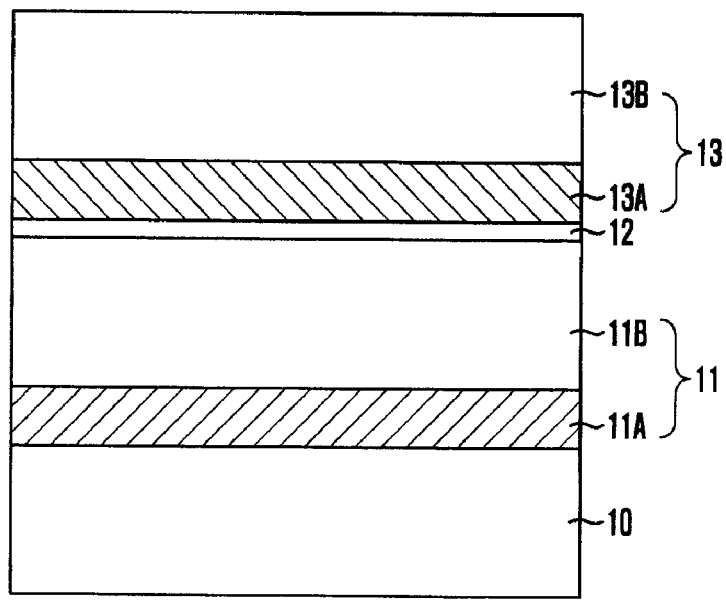
FIG. 1 is a cross-sectional view illustrating a structure of a capacitor in accordance with at least one embodiment.

Other objects and advantages can be understood by the following description, and become apparent with reference to the disclosed embodiments. In the drawings, the dimensions of layers and regions may be exaggerated for clarity of illustration. Like reference numerals refer to like elements throughout. It will also be understood that when a layer, a film, a region, or a plate is referred to as being 'on' another one, it can be directly on the other one, or one or more intervening layers, films, regions, or plates may also be present.

As illustrated in FIG. 1, a bottom electrode 11 is formed over a substrate 10 provided with predetermined lower structures. In some embodiments, the bottom electrode 11 is formed as a stack structure of a $Ru_xTi_yO_z$ film 11a and a Ru film 11b, where x, y and z are positive real numbers. Because the $Ru_xTi_yO_z$ film 11a has a high work function and a greater adhesive force, similar to the $RuO_2$ film, the $Ru_xTi_yO_z$ film 11a is interposed under the Ru film 11b, and acts as an adhesive layer to maintain electric properties of the capacitor. Furthermore, a Ti—O combination of the $Ru_xTi_yO_z$ film 11a is very strong, and thus the $Ru_xTi_yO_z$ film 11a is not easily reduced in the subsequent processes including the heat treatment, thereby preventing a so-called unfastened effect of the film and the formation of voids between the electrodes and the substrate.

A dielectric layer 12 is formed over the bottom electrode 11. The dielectric layer 12 is formed of high-k material, including, for example, $TiO_2$, $SrTiO_2$, and $BaSbTiO_3$.

A top electrode 13 is formed over the dielectric layer 12. Similar to the bottom electrode 11, the top electrode 13 may be formed of the $Ru_xTi_yO_z$ film 13a having a high work function, a greater adhesive force, and a lower reduction tendency, where the Ru film 13b is formed thereon.

Fabricating the $Ru_xTi_yO_z$ film is described below, referring to FIGS. 2 and 3.

Figure 2:
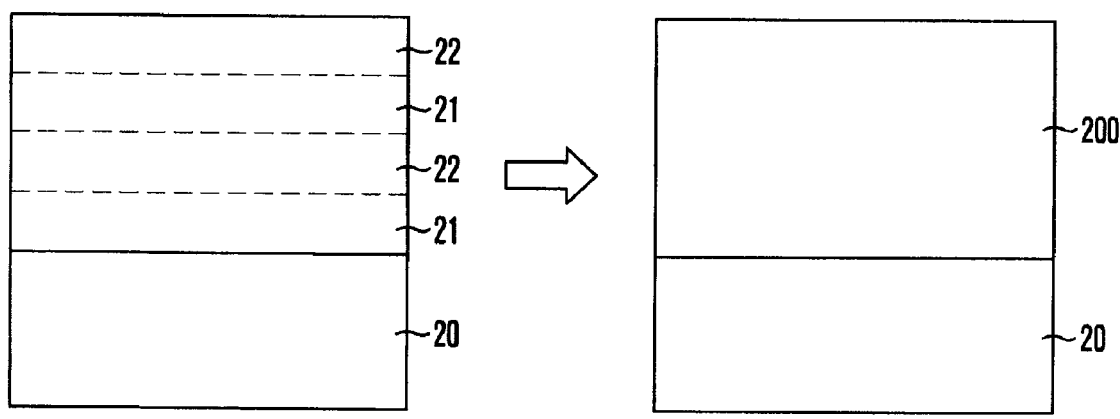
FIG. 2 illustrates the method for fabricating $Ru_xTi_yO_z$ film in accordance with at least one embodiment.

FIG. 2 illustrates a method for fabricating the $Ru_xTi_yO_z$ film in accordance with at least one embodiment.

As illustrated in FIG. 2, a Ru—O film 21 is formed over a substrate 20, provided with predetermined lower structures. The Ru—O film 21 may be a $RuO_2$ film. The Ru—O film 21 is formed through an atomic layer deposition (ALD), and is described below with reference to FIGS. 3A and 3B.

Subsequently, a Ti film 22 is formed over the Ru—O film 21. The Ti film 22 is formed through the ALD similarly to the Ru—O film 21, and is described below with reference to FIGS. 3A and 3B.

The formation processes of the Ru—O film 21 and the Ti film 22 may be repeatedly performed alternately, as shown in FIG. 2. The formation process of Ti film 22 may be first performed and then the formation process of Ru—O film 21 may then be performed.

In this manner, when the formation processes of the Ru—O film 21 and the Ti film 22 are alternately performed, Ti nano particles invade into the Ru—O film 21 in place of the respective layers being separated, and as a result, a $Ru_xTi_yO_z$ film 200 having a combination structure of Ru—Ti—O is formed.

In some embodiments, after forming the $Ru_xTi_yO_z$ film 200, the film 200 is subjected to a subsequent thermal treatment for increasing a crystalline bonding. The subsequent process may be performed using a rapid thermal treatment or a furnace thermal treatment at a temperature range of approximately 400° C. to approximately 800° C.

Figure 3A:
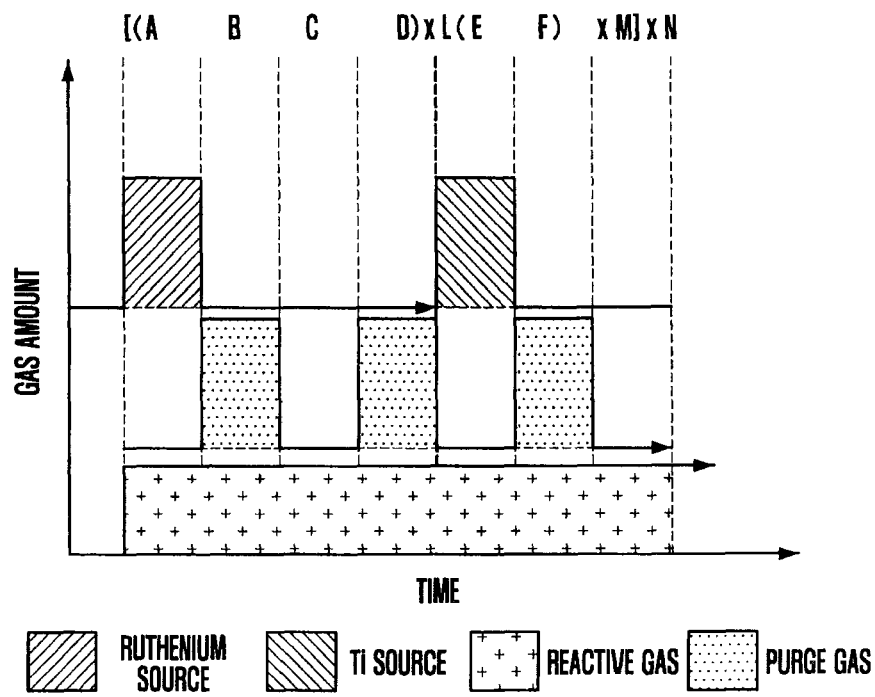
FIGS. 3A and 3B illustrate gas flows during a formation of the $Ru_xTi_yO_z$ film through an atomic layer deposition (ALD).
Figure 3B:
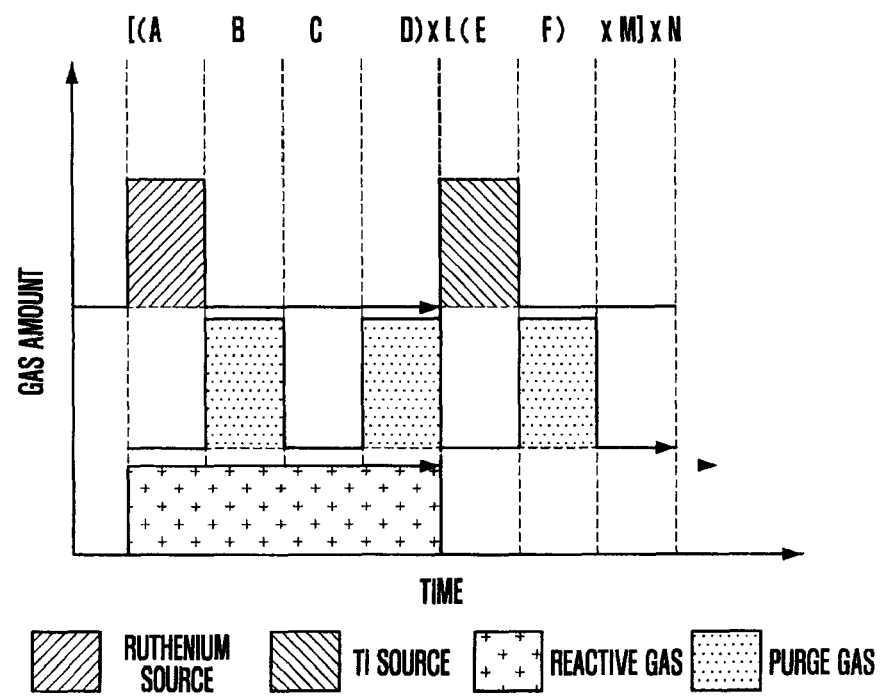

FIGS. 3A and 3B illustrate a gas flow during a formation of the $Ru_XTi_YO_Z$ film 200 through the ALD.

As described above, the $Ru_XTi_YO_Z$ film 200 is formed through an alternate deposition of the Ru—O film 21 and the Ti film 22, and is described below.

Referring to FIG. 3A, the formation process of the Ru—O film 21 through the ALD includes a first process (a) of injecting a Ru source into a reaction chamber, a second process (b) of purging the reaction chamber, a third process (c) of injecting a reactive gas into the reaction chamber, and a fourth process (d) of purging the reaction chamber. The first to fourth processes are provided as one cycle. The cycle is repeatedly performed L times to uniformly deposit the film in a desired thickness.

The reaction gas continuously flows into the reaction chamber during the formation of Ru—O film 21. That is, the Ru source and the reactive gas flow into the chamber in the first process, and a purge gas and the reactive gas flow into the chamber in the second and fourth processes, and only reactive gas flows into the reaction chamber in the third process.

After forming a desired thickness of the Ru—O film 21, the formation process of the Ti film 22 through the ALD includes a fifth process (e) of injecting a Ti source into the reaction chamber, and a sixth process (f) of purging the reaction chamber. The fifth process and the sixth process are performed as one cycle, and the one cycle is repeatedly performed M times to uniformly deposit the film to a desired thickness.

The reactive gas continuously flows into the reaction chamber during the formation of Ti film 22. That is, the Ti source and the reactive gas flow into the chamber in the fifth process, and purge gas and the reactive gas flow into the chamber in the sixth process.

As described above, the $Ru_XTi_YO_Z$ film 200 as a stack structure can be formed by repeatedly performing N times the formation processes of the Ru—O film 21 and the Ti film 22.

With reference to FIG. 3B, the formation process of the Ru—O film 21 is the same as that described in FIG. 3A, but has a difference in stopping the flow of reactive gas during a formation of the Ti film 22. That is, only Ti source flows into the chamber in the fifth process, and only purge gas flows into the chamber in the sixth process. Stopping the flow of reactive gas during a formation of the Ti film 22 is intended to reduce the oxygen content of the $Ru_XTi_YO_Z$ film 200 as compared with FIG. 3A. A specific resistance value of the $Ru_XTi_YO_Z$ film 200 can be adjusted by controlling a flow of reactive gas in the formation of the Ti film 22 to adjust the oxygen content of the $Ru_XTi_YO_Z$ film 200.

However, besides the flow control of the reactive gas during the formation of Ti film 22, various ways exist for adjusting a composition of the $Ru_XTi_YO_Z$ film 200. For example, the oxygen content of the $Ru_XTi_YO_Z$ film 200 may be adjusted by controlling the flow amount of reactive gas; or a composition of the $Ru_XTi_YO_Z$ film 200, where each value of x, y, and z, may be adjusted by the repetition number L of the first to fourth cycling processes, the repetition number M of the fifth and sixth cycling processes, and the repetition number N of the Ru—O film 21 and the Ti film 22 stacking.

The formation processes of the $Ru_XTi_YO_Z$ film 200 through the ALD may be formed wia temperature range of approximately 250° C. to approximately 500° C. The injection amount of the Ru source may range from approximately 50 sccm (standard cubic centimeter per minute) to approximately 500 sccm, and the injection amount of the Ti source may range from approximately 50 sccm to approximately 500 sccm. The injection amount of the purge gas, i.e., $Ar/N_2$, may range from approximately 100 sccm to approximately 3000 sccm, and the injection amount of the reactive gas, i.e., $O_2$ or $O_3$ may range from approximately 100 sccm to 2000 sccm. Meanwhile, during the formation of the Ru—O film 21 the first process using the Ru source and the reactive gas may be performed for approximately 0.1 second to approximately 10 seconds, and the second process using the purge gas and the reactive gas may be performed for approximately 1 second to 10 seconds, and the third process using only reactive gas may be performed for approximately 1 second to approximately 10 seconds. Furthermore, the fourth process using the purge gas and the reactive gas, or the Ti source may be performed for approximately 1 second to approximately 5 seconds. During a formation of the Ti film 22 the fifth process using the Ti source and the reactive gas, or the Ti source, may be performed for approximately 0.1 second to approximately 10 seconds, and the sixth process using the purge gas and the reactive gas, or the purge gas may be performed for approximately 0.1 second to approximately 5 seconds.

In accordance with at least some embodiments, a $Ru_XTi_YO_Z$ film with the greater adhesive force, the high work function, and lower reduction tendency is used as the material of the top and the bottom electrodes, thereby enhancing properties of capacitor and solving the difficulties arisen during a fabrication of the capacitor. In addition, since the $Ru_XTi_YO_Z$ film is formed through using ALD, thereby resulting in an excellent deposition property, various capacitor structures, e.g., a concave type, a cylinder type, a pillar type etc., can be adapted using the disclosed $Ru_XTi_YO_Z$ film.

Based upon the embodiments disclosed above, a $Ru_XTi_YO_Z$ film with a greater adhesive force, a high work function, and a lower reduction tendency is used as a bottom or top electrode, thereby ensuring electrical properties of the capacitor and helps to prevent formations of inferior products.

While various embodiments have been described, it will be apparent to those skilled in the art that various changes and modifications may be made.

What is claimed is:

1. A method of fabricating a capacitor through a sequential formation of a bottom electrode, a dielectric layer and a top electrode over a substrate, the method comprising:
    forming a $Ru_XTi_YO_Z$ film during a formation of at least one of the bottom electrode and top electrode, where x, y and z are positive real numbers,
    wherein the forming of the $Ru_XTi_YO_Z$ film comprises:
        forming a Ru—O film via atomic layer deposition (ALD); and
        forming a Ti film via ALD,
        wherein the forming of the Ru—O film and the forming of the Ti film are performed alternately at least one time,
    wherein the forming of the Ru—O film comprises:
        injecting a Ru source and a reactive gas into a reaction chamber;
        performing a primary purge by injecting a purge gas and the reactive gas into the reaction chamber;
        injecting the reactive gas into the reaction chamber; and
        performing a secondary purge by injecting the purge gas and the reaction gas into the reaction chamber,
        wherein the injecting of the Ru source through the secondary purge are performed as one cycle at least one time.

2. The method of claim 1, wherein the forming of the Ti film comprises:
    injecting a Ti source and the reactive gas, or the Ti source into the reaction chamber; and performing a tertiary purge by injecting the purge gas and the reactive gas into the reaction chamber, wherein the injecting of the Ti source and the tertiary purge are performed as one cycle at least one time.

3. The method of claim 2, wherein a composition of the $Ru_XTi_YO_Z$ film is adjusted by at least one factor selected from the group consisting of a flow amount of the reactive gas, a repetition number of the cycle for forming the Ru—O, a repetition number of the cycle for forming Ti film, and a repetition number of stacking the Ru—O film and the Ti film.

4. The method of claim 2, wherein the reactive gas is $O_2$ or $O_3$.

5. The method of claim 2, wherein an injection amount of the Ti source ranges from approximately 50 sccm to approximately 500 sccm, and an injection amount of the purge gas ranges from approximately 100 sccm to approximately 3000 sccm, and an injection amount of the reactive gas ranges from approximately 100 sccm to approximately 2000 sccm.

6. The method of claim 2, wherein the injecting of Ti source and reactive gas, or the injecting of the Ti source is performed for approximately 0.1 second to approximately 10 seconds, and the purge is performed for approximately 0.1 second to approximately 5 seconds.

7. The method of claim 1, wherein a composition of the $Ru_XTi_YO_Z$ film is adjusted by at least one factor selected from the group consisting of a flow amount of the reactive gas, a repetition number of the cycle for forming the Ru—O, a repetition number of a cycle for forming the Ti film, and a repetition number of stacking the Ru—O film and the Ti film.

8. The method of claim 1, wherein the reactive gas is $O_2$ or $O_3$.

9. The method of claim 1, wherein an injection amount of the Ru source ranges from approximately 50 sccm to approximately 500 sccm, and an injection amount of the purge gas ranges from approximately 100 sccm to approximately 3000 sccm, and an injection amount of the reactive gas ranges from approximately 100 sccm to approximately 2000 sccm.

10. The method of claim 1, wherein the injecting of the Ru source and the reactive gas are performed for approximately 0.1 second to approximately 10 seconds, and the primary purge is performed for approximately 1 second to 10 seconds, and the injection of the reactive gas is performed for approximately 1 second to approximately 10 seconds, and the secondary purge is performed for approximately 1 second to approximately 5 seconds.

11. The method of claim 1, wherein the forming of the $Ru_XTi_YO_Z$ film is performed at a temperature range of approximately 250° C. to approximately 500° C.

12. The method of claim 1, further comprises performing a thermal treatment after the $Ru_XTi_YO_Z$ film is formed.

13. The method of claim 12, wherein the thermal treatment is performed through a rapid thermal treatment or a furnace thermal treatment.

14. The method of claim 13, wherein the thermal treatment is performed at a temperature range of approximately 400° C. to approximately 800° C.

* * * * *